(12) United States Patent
de Vries

(10) Patent No.: US 6,621,913 B1
(45) Date of Patent: Sep. 16, 2003

(54) DIGITAL OSCILLOSCOPE WITH TRIGGER QUALIFICATION BASED ON PATTERN RECOGNITION

(75) Inventor: Johan de Vries, Almelo (NL)

(73) Assignee: Fluke Corporation, Everett ( * ) Notice: Subject to any disclaimer, the term of this patent is extended or adjusted under 35 U.S.C. 154(b) by 0 days.

(21) Appl. No.: 08/816,434

(22) Filed: Mar. 14, 1997

Related U.S. Application Data

(63) Continuation of application No. 08/431,335, filed on Apr. 27, 1995, now abandoned.

(51) Int. Cl.[7] .................................................. G06K 9/00
(52) U.S. Cl. .................... 382/100; 315/392; 324/223; 327/205
(58) Field of Search .................... 382/100, 181; 315/168, 392; 324/211, 322, 223; 327/291, 205; 331/145, 165; 368/113, 115

(56) References Cited

U.S. PATENT DOCUMENTS

| | | | | |
|---|---|---|---|---|
| 4,510,571 A | | 4/1985 | Dagostino et al. | 364/487 |
| 4,585,975 A | * | 4/1986 | Wimmer | 315/307 |
| 4,716,345 A | * | 12/1987 | Shank et al. | 364/487 |
| 4,823,077 A | * | 4/1989 | Landgraf et al. | 324/121 R |
| 4,855,682 A | * | 8/1989 | Van Groningen | 327/199 |
| 4,947,338 A | * | 8/1990 | Vistica | 364/487 |
| 5,107,205 A | * | 4/1992 | Ebihara | 364/487 |
| 5,223,784 A | * | 6/1993 | Nelson et al. | 324/121 R |
| 5,235,270 A | * | 8/1993 | Shimada et al. | 324/121 R |

* cited by examiner

Primary Examiner—Jayanti K. Patel
(74) Attorney, Agent, or Firm—George T. Noe; Richard A. Koske

(57) ABSTRACT

A pattern recognition system to qualify valid triggering for digital storage oscilloscopes. Valid trigger qualification may be established from recognition of triggering level and interval time information, as well as other pattern-related information, to start or stop waveform acquisition. Trigger qualification may be established from either a pattern match or a mismatch. The trigger recognition system may be further extended to the occurrence of complex signals, such as those associated with television, rotating machinery, or other phenomena occuring in predetermined or known patterns.

5 Claims, 3 Drawing Sheets

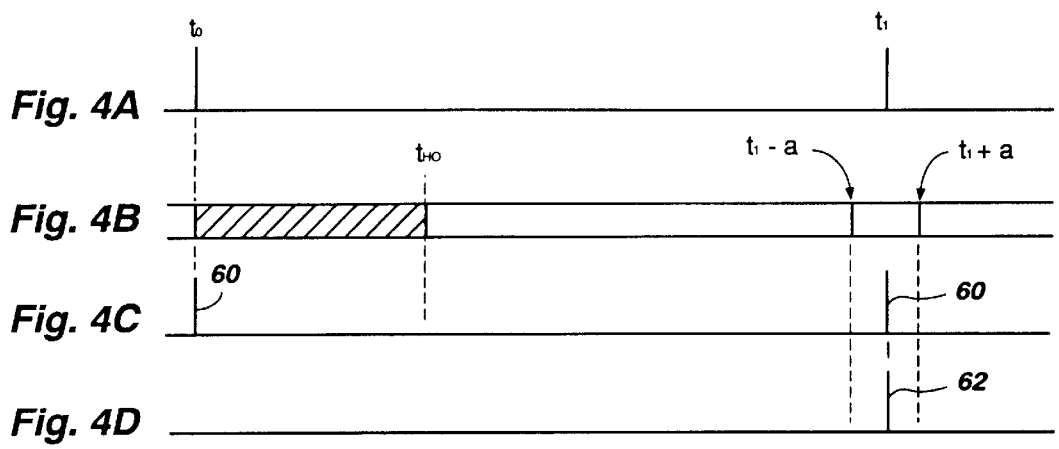
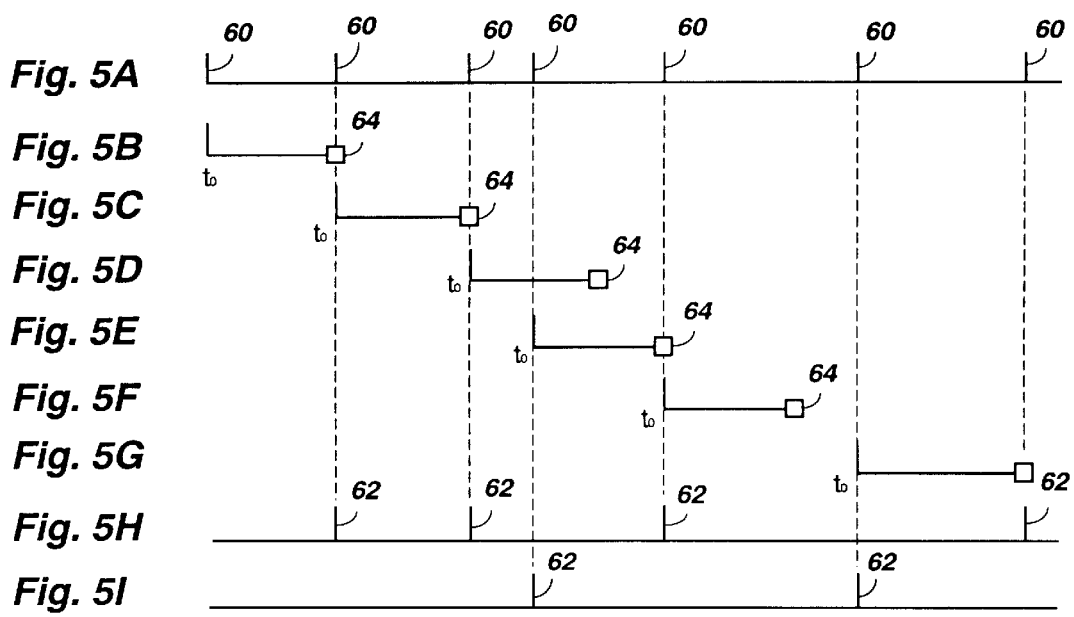
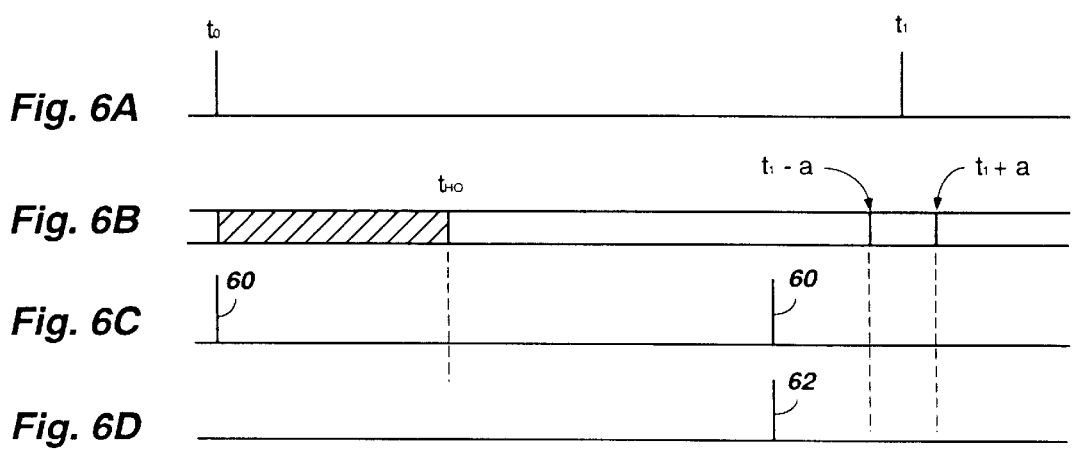

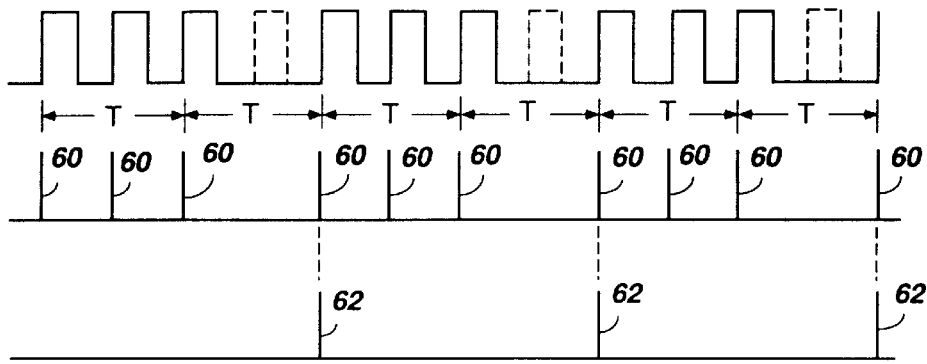
Fig. 7A
Fig. 7B
Fig. 7C
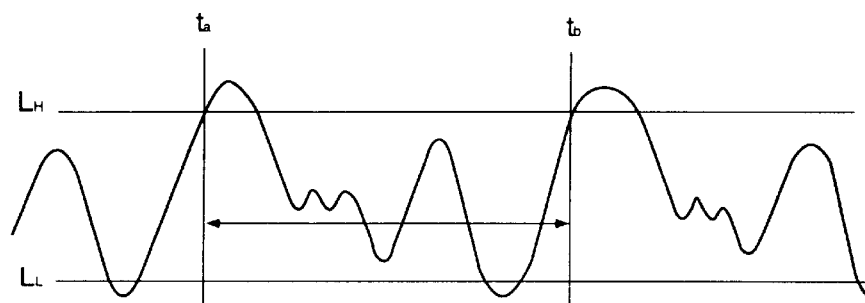
Fig. 8A
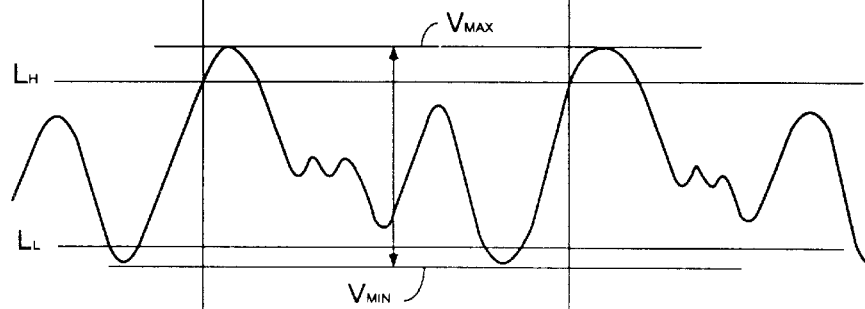
Fig. 8B
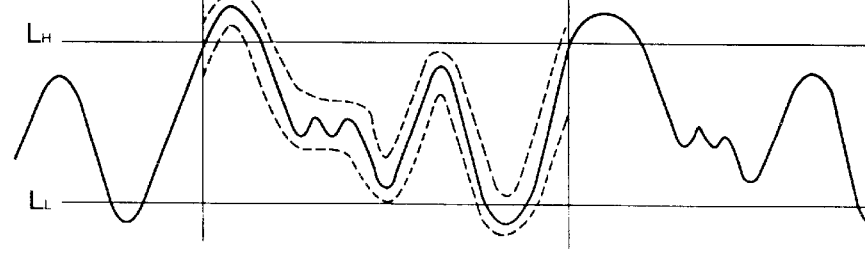
Fig. 8C

DIGITAL OSCILLOSCOPE WITH TRIGGER QUALIFICATION BASED ON PATTERN RECOGNITION

This application is a continuation of application Ser. No. 08/431,335, filed Apr. 27, 1995, now abandoned.

BACKGROUND OF THE INVENTION

This invention relates generally to triggering arrangements for oscilloscopes, and in particular to a pattern recognition system for qualifying valid triggering conditions for digital storage oscilloscopes.

Typical digital oscilloscopes use a single level-crossing trigger detection to issue valid trigger signals to start or stop waveform acquisition. More sophisticated oscilloscopes employ a limited form of pattern recognition, such as waveform templates, or other information in which an input signal deviates from an expected pattern to qualify valid triggering events. This is known in the art as "baby-sitting" to catch random anomalies, infrequent glitches, or other out-of-the-ordinary events. Such instruments are expensive and complicated to operate.

Many users are only interested in a stable image of an input signal to see whether or not something is wrong with the shape of the signal. For these users, operating the instrument is only a bothersome necessity. This is particularly true when the signals are complex waveforms and the user wishes to view only a portion of interest, such as television waveforms or waveforms generated by rotating machinery. Also, it would be desirable to trigger on anomalies, such missing pulses or wrong time intervals based on unpredictable timing of events. In particular, it would be desirable to have in a digital oscilloscope a flexible triggering system capable of triggering on a variety of pattern-related phenomena, such as a match (or mismatch) of time intervals, match (or mismatch) of signal amplitudes or waveshapes, or partial matching such as recognition of the sync and burst portions, while ignoring the video portions, of television signals.

SUMMARY OF THE INVENTION

In accordance with the present invention, valid trigger qualification in digital storage oscilloscopes may be established from recognition of triggering level and time interval information, as well as other pattern-related information, to start or stop waveform acquisition.

In the preferred embodiment, an acquisition logic circuit extracts a pair of triggering levels from peak-to-peak amplitude information of an input signal, and applies such triggering levels to a trigger generator that employs dual comparators and an RS flip-flop to generate raw triggers when the input signal passes through both triggering levels. The input signal is then analyzed in the presence of the raw trigger signals for pattern matches or mismatches. For example, pattern-related parameters may include time intervals between events, peak-to-peak amplitude, specific waveshapes or partial waveshapes, the number of pulses in a pulse train, or other quantifiable phenomena associated with signal patterns.

The smallest representation of a pattern may be described as time information in addition to trigger-level information. For example, triggering conditions may be established to issue a valid trigger signal, and thus start or stop waveform acquisition to subsequently store and display a waveform only when a raw trigger event occurs from a level crossing and when the interval of a signal matches a previously-established interval, or in certain situations when the interval fails to match a previously-established interval. Similarly, a triggering operation may be established to generate a valid trigger when an anomaly, such as an expected raw trigger falling outside a predetermined time zone or pattern, indicating an interval or pattern mismatch. Triggering on such a mismatch would permit this condition to be detected and stored.

The trigger recognition system of the present invention may further be extended to the occurrence of complex signals, such as those associated with television, rotating machinery, or other phenomena occurring in predetermined or known patterns.

It is therefore one feature of the present invention to provide a digital oscilloscope with automatic trigger qualification from pattern recognition.

It is another feature of the present invention to provide a system for automatically establishing valid triggering for a digital oscilloscope using triggering level and time information.

It is another feature of the present invention to provide an oscilloscope capable of triggering on signal anomalies, such as mismatching patterns.

Other features, and advantages of the present invention will become obvious to those having ordinary skill in the art upon a reading of the following description when taken in conjunction with the accompanying drawings.

BRIEF DESCRIPTION OF THE DRAWINGS

FIGS. 4A–4D is a series of event diagrams to explain valid trigger recognition when there is a match between a raw trigger and a previously-established time interval;

FIGS. 5A–5I is a series of event diagrams showing the resetting of time intervals in issuing valid trigger signals;

FIGS. 6A–6D is a series of event diagrams to explain valid trigger recognition when there is a mis-match between a raw trigger and a previously-established time interval;

FIGS. 7A–7C is a series of event diagrams to explain valid trigger recognition when pulses in a pulse train are missing; and FIGS. 8A–8C show different levels of complexity in patten recognition.

DETAILED DESCRIPTION OF THE INVENTION

Figure 1:
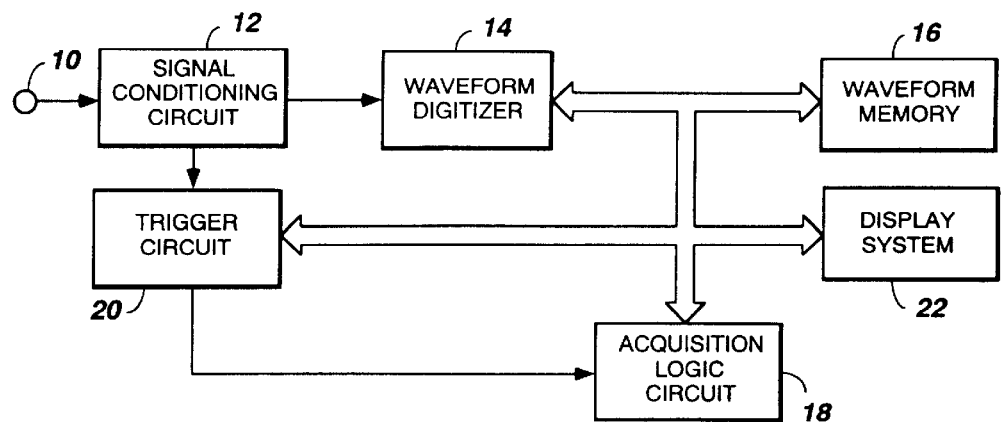
FIG. 1 is a generalized block diagram of a digital oscilloscope having extended triggering capability in accordance with the present invention.

Referring to FIG. 1 of the drawings, there is shown a generalized block diagram of a digital oscilloscope having trigger recognition capabilities in accordance with the present invention. Input analog signals are applied via an input terminal 10 to a signal conditioning circuit 12, which may suitably include conventional input coupling, attenuators, and circuit 12, which may suitably include conventional input coupling, attenuators, and preamplifiers to condition the input signal to suitable levels for further processing by a waveform digitizer 14. Waveform digitizer 14 may suitably include a conventional analog-to-digital converter which samples and converts instantaneous points along the waveform of the input signal to digital data at a rate determined by an internal sampling clock. The stream of digital data thus produced is stored in a waveform memory 16 under control of an acquisition logic circuit 18, which may include a microprocessor or the like in conjunction with digital signal processing circuits to provide waveform acquisition logic in the conventional manner as well as provide valid trigger signals in accordance with the present invention.

The input analog signal is picked off from the signal conditioning circuit 12 and applied to one input of a raw-trigger circuit 20. Raw-trigger circuit 20 compares the input analog signal with level information provided by the acquisition logic circuit 18, and generates raw trigger signals upon the occurrence of level-crossing events. The raw trigger signals are applied to the acquisition logic circuit 18, where such raw trigger signals are further processed in accordance with the present invention to issue valid trigger signals to halt waveform acquisition and freeze the contents of waveform memory 16. Thereafter, the waveform information stored in memory 16 may be processed and sent to a display system 22 having a display screen to display waveforms in conventional amplitude-versus-time format.

Figure 2:
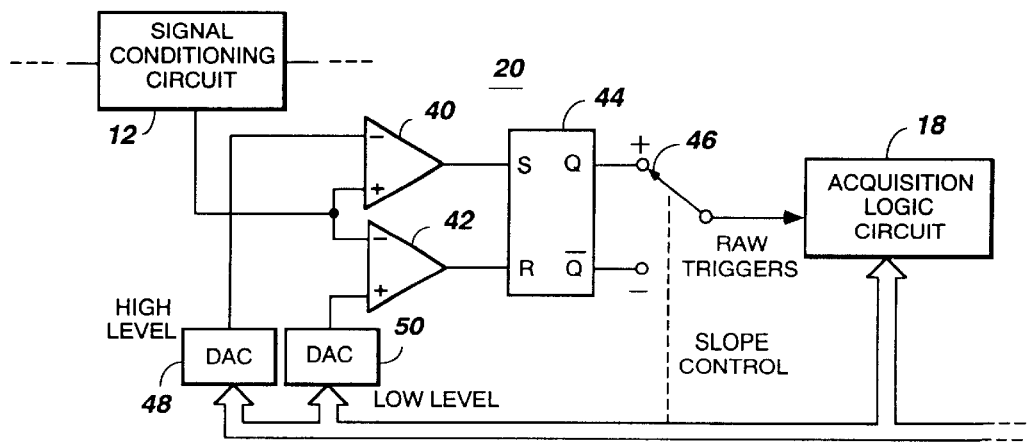
FIG. 2 is a simplified block diagram of a dual-level triggering circuit.

In the preferred embodiment, raw-trigger circuit 20 is a dual-level triggering circuit comprising a pair of comparators 40 and 42, and a flip-flop (FF) 44, as shown in block diagram form in FIG. 2. A first triggering level, which for purposes of explanation will be labeled the high triggering level, is applied to the − input of comparator 40. A second triggering level, which again for purposes of explanation will be labeled the low triggering level, is applied to the + input of comparator 42. The input analog signal is applied respectively to the + and − inputs of comparators 40 and 42. The output of comparator 40 is connected to the Set input of FF 44, while the output of comparator 42 is connected to the Reset input of FF 44. The Q and /Q outputs of FF 44 are opposite in polarity, and either may be selected (commonly known in the art as + or − slope selection) by a switch 46 in response to slope control signals (shown by dashed line in FIG. 2) from control logic circuit 18 to provide raw triggers for the system.

The two triggering levels, while such levels may be derived from potentiometers, are provided by digital-to-analog converters (DACs) 48 and 50 in response to trigger-level data from acquisition control circuit 18 in the preferred embodiment. The high and low levels may be derived automatically by detecting the peaks of the input analog signal and adjusting the two levels for best operation between the two peaks. A method for detecting the peaks of the input signal and providing the two triggering levels is described in my co-pending U.S. patent application Ser. No. 08/304,909, filed Sep. 12, 1994, entitled "A Method of Signal Analysis Employing Histograms to Establish Stable Scaled Displays in Oscilloscopes." Other methods for determining signal peaks are also well known in the art. As can be appreciated, the high and low levels may be adjusted any two points (or even the same point) within the peak-to-peak amplitude limits of an input signal. In fact, several adjustments may take place to obtain best triggering.

In operation, depending on the polarity or slope selected for triggering (as determined by which output of FF 44 is used for raw triggers), one triggering level is the actual triggering level while the other creates a hysteresis gap. It should be mentioned here that the term "hysteresis gap" has the ordinary meaning associated with trigger circuits such as Schmitt trigger comparators, wherein a signal must pass through a first level to cause a change in output state, and then the signal must pass back through that level to a second level to cause another change in output state, rather than switching again at the first level.

Figure 3:
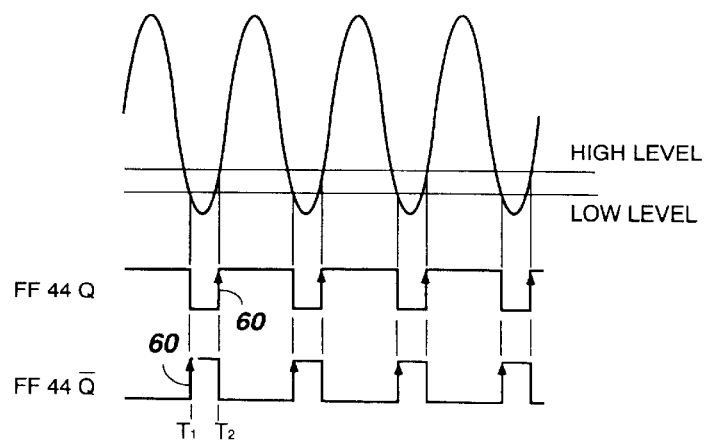
FIG. 3 shows dual triggering waveforms to explain the circuit of FIG. 2.

Referring to FIG. 3, assume that the high and low triggering levels are as shown, and that it is desired to trigger on the positive-going slope of a sine wave input signal. At a time T1, the negative-going input sine-wave signal passes through the low level, causing the output of comparator 42 to switch to a high state. The high transition so produced is applied to the Reset input of FF 44, causing the Q output to switch to a low state. The sine wave signal reaches its negative peak and reverses direction, passing again through the low level (comparator 42 switches to a low state, but is of no consequence) and continues in a positive-going direction, and at a time T2, passes through the high level, causing the output of comparator 40 to switch to a high state. The high transition at the output of comparator 40 is applied to the Set input of FF 44, causing the Q output to switch to a high state. Continuing on, the input signal reaches its positive peak, reverses direction and again passes through the high level in a negative-going direction (comparator 40 switches to a low state), completing a cycle as it passes through the low level, causing the output of comparator 42 to switch to a high state.

The positive-going (low-to-high) transitions at the output of FF 44 as shown in this embodiment may be utilized by the acquisition system as raw triggers 60, represented by arrows in FIG. 3. As mentioned above, if + slope is selected, the positive-going transitions at the Q output of FF 44 are applied via switch 46 to the control logic circuit 18 as raw trigger signals. Likewise, if − slope is selected, the positive-going transitions at the /Q outputs of FF 44 are applied to the acquisition logic circuit 18 as raw triggers.

In accordance with the present invention, valid trigger qualification is determined by pattern recognition. Aspects of pattern recognition may include time intervals, signal amplitudes or waveshapes, or other quantifiable phenomena associated with signal patterns. The smallest representation of a pattern may be described as time information in addition to trigger-level information. For example, triggering conditions may be established to issue a valid trigger signal, and thus start or stop waveform acquisition to subsequently store and display a waveform, only when a raw trigger event occurs from a level crossing and the frequency or pattern of a signal matches that from a previously-established signal. Similarly, a triggering operation may be established to generate a valid trigger when an anomaly, such as an unexpected raw trigger falling outside a predetermined time zone, indicating a pattern mismatch. Triggering on such a mismatch would permit this condition to be detected and stored.

The time information required for trigger recognition may derived from a recurring input signal in a number of ways, for example, by measuring the elapsed time between two recurring trigger events, or by using a time histogram as described in the aforementioned application Ser. No. 08/304, 909. Acquisition logic circuit 18 creates a time window in which a trigger event (raw trigger) is expected after a first trigger event.

Referring to the event diagrams of FIGS. 4A–4D, wherein the horizontal lines represent time, let us suppose that the time from $t_0$ to $t_1$ is the expected interval derived from a previous measurement, such as depicted by the two events shown in FIG. 4A, and it is desired to generate a valid trigger when a signal has an frequency or repetition rate that matches. Acquisition logic circuit 18 may suitably include a counter to determine the time between two raw triggers by counting the number of digital samples acquired over an interval between raw trigger events. Since a large number of samples, e.g., 500 samples, may be counted to determine whether a time interval matches a previously-stored interval, some tolerance may be appropriate, such as a lower time limit ($t_1-a$) and an upper time limit ($t_1+a$), where a is equal to a predetermined number of counts, for example, five counts, to establish an expected-time window of 495 to 505 counts. Refer to the time mask of FIG. 4B, wherein the shaded area represents a hold-off time period beginning at time $t_0$ and ending at time $t_{HO}$, and an expected-trigger window is bounded by the short vertical lines at times $t_1-a$ and $t_1+a$. In FIG. 4C, any raw triggers which would occur during the hold-off period are discarded, as are raw triggers that would fall outside the expected-trigger window. However, a raw trigger 60 falls within the expected-trigger window, resulting in a valid trigger 62 being recognized as shown in FIG. 4D. Each time a valid trigger 62 is issued, the raw trigger 60 that resulted in the valid trigger 62 resets the recognition system to time $t_0$, beginning a new time interval.

Thus, a first trigger event occurs at time $t_0$ when a first raw trigger 60 is produced, and then if a second raw trigger 60 occurs within the time window within which it is expected, a valid trigger 62 is issued, starting or stopping acquisition, as appropriate, capturing the waveform in waveform memory 16, and resetting the time interval to a new time $t_0$. This action repeats as long as raw triggers match the expected time $t_0$–$t_1$ and fall within the expected-time window. In this situation, if a raw trigger fails to occur within the expected-time window, or if such raw trigger occurs before the expected-time window is reached, the counter resets itself to zero and begins counting again at a new time $t_0$ to a new time $t_1$, and consequently, establishes a new expected-trigger window. The process will repeat until valid triggers are issued and stable triggering is achieved. In addition, a predetermined hold-off time ($t_{HO}$–$t_0$) may be inserted to filter out high frequency raw triggers, a particularly useful feature when the trigger recognition system is used in other modes of operation.

Perhaps this action can be better understood from FIGS. 5A–5I, which show a ladder diagram of valid trigger issuance. Raw triggers 60 are seen occurring along a time line in FIG. 5A. FIG. 5B shows a time interval running from time $t_0$ to an expected-trigger window 64, which is depicted as a small box for simplicity of understanding. A raw trigger 60 coincides with the expected-trigger window 64, and so a valid trigger 62 is issued in FIG. 5H. The time interval is reset to time $t_0$ upon issuance of a valid trigger signal 62, and a new time interval is generated as shown in FIG. 5C. The process is repeated in FIG. 5D, but notice that a raw trigger 60 does not occur during the expected-trigger window 64 because the repetition rate of the raw triggers 60 has increased. Instead, a raw trigger 60 occurs before the expected-time window 64 in FIG. 5D, and this resets the recognition system to a new time $t_0$ as shown in FIG. 5E. In FIG. 5E, a raw trigger 60 coincides with the expected-trigger window 64, and once again, a valid trigger 62 is issued (see FIG. 5H), resetting the time interval to $t_0$ in FIG. 5F. In FIG. 5F, the time interval ends without a raw trigger appearing. When the next raw trigger does appear, a new time interval is determined between the next two successive raw triggers as shown in FIG. 5G and the process repeats.

It should be noted that the valid triggers shown in FIG. 5H could be used as intermediate raw triggers to become valid triggers only after some other qualifying pattern parameters, such as amplitude, waveshape, or number of pulses, are met.

In a fault detection mode, unexpected raw triggers 60 are issued as valid triggers 62 in FIG. 5I.

Another mode of operation is fault-detection mode shown in FIGS. 6A–6D in which there is a mis-match between a raw trigger and previously-established time interval, that is, when raw triggers 60 that are expected to occur within the expected-time window occur outside the window. To capture such faults or time anomalies, it is desired to issue a valid trigger when a raw trigger falls outside the expected-time window bounded by $t_1-a$ and $t_1+a$. An example is in the case of rotating machinery, such as internal combustion engines, where the crankshaft may be turning at a constant rate, and raw triggers occur at equal intervals. If the rotation suddenly accelerates (or decelerates), the time interval between raw triggers changes, and the raw trigger falls outside the window. Acquisition logic circuit 18, in this situation, reverses the time-mask as shown in FIG. 6B to ignore raw triggers which fall within the expected-time window, and instead, recognize raw triggers that fall outside the expected time window as shown in FIG. 6C. Of course, any raw trigger event that occurs during the hold-off period, which may be adjusted as desired, will be ignored. The raw trigger that falls outside the expected-time window is in this operating mode recognized as a valid trigger event 62 as shown in FIG. 6D, and acquisition logic circuit 18 issues a valid trigger signal, halting waveform acquisition and storing the events leading up to the sudden acceleration or deceleration.

Another special application of the fault-detecting mode is a situation such as shown in FIGS. 7A–7C, where a missing pulse in a pulse train causes different time between events, and so it is desired to trigger on the missing pulse. Let us suppose that a raw trigger 60 is generated for each pulse as shown in FIGS. 7A and 7B. For example, if a pulse is expected to occur where one is missing, as represented by dashed lines as shown in FIG. 7A, there will be no raw trigger occurring as shown in FIG. 7B. The raw triggers that occur after a longer period of time are recognized as valid triggers 62 as shown in FIG. 7C, and issued to halt the acquisition.

The trigger recognition system may be further extended to test the occurrence of complex signals, such as those associated with television or other phenomena occurring in predetermined or known patterns. FIGS. 8A–8C shows different levels of pattern recognition when a known waveform is fairly complex, and a valid trigger issues when all of the time and pattern parameters match (or when they mismatch if a fault detection mode is selected).

Referring to FIGS. 8A–8C, there are shown two cycles of some arbitrary waveform for purposes of explanation. Two triggering levels $L_H$ and $L_L$ are adjusted between a pair of detected peak amplitudes $v_{max}$ and $v_{min}$, and raw triggers 60 are generated at times $t_a$ and $t_b$, when the signal level passes in a positive-going direction through level $L_H$. A first test to determine a valid trigger might to be to measure the time interval between raw triggers produced at times $t_a$ and $t_b$ as shown in FIG. 8A. If this test passes, that is, if the correct time interval is present, the next test is to determine whether the peak signal amplitudes are substantially the same as $v_{max}$ and $v_{min}$ measured earlier, as shown in FIG. 8B. Of course, if the time intervals match, and if the peak amplitudes match, the test for pattern recognition may continue. (If any step fails in the pattern recognition sequence, the testing is stopped and valuable time will not be wasted on further steps of pattern recognition.) In FIG. 8C, a template derived from the waveform is established, shown as dashed lines, and a further pattern recognition test is conducted to determine whether the waveform passes through the template unimpeded and without exceeding the threshold limits of the template. The template can now be used in either of two ways: first, to permit a valid trigger to issue as long as the waveform passes through the template, or second, to permit a valid trigger to issue in the event the waveform touches or passes through the threshold limits of the template at any point. A powerful concept of the template approach to pattern recognition is that partial templates may be constructed to encompass specific points of interest, such as for the burst and sync portions of a television signal while ignoring the video portion.

Trigger analysis as described above may proceed through a series of steps to qualify a valid trigger, aborting the analysis if any particular test fails. This permits rapid resetting of the trigger recognition system without performing further tests. For example, in connection with FIGS. 8A–8C, if the raw triggers fail to occur at the expected time intervals as shown in FIG. 8A, further testing with templates or other patterns is unnecessary, and the system may be reset to start a new trigger recognition process.

Additionally, raw triggers may be cascaded to provide intermediate levels of otherwise valid triggers which in turn must form a pattern before a valid trigger can issue, or other predetermined patterns must exist for at least one of the valid triggers for a valid trigger to issue.

While I have shown and described the preferred embodiment of my invention, it will be obvious to those skilled in the art that many changes and modifications may be made without departing from my invention in its broader aspects. It is therefore contemplated that the appended claims will cover all such changes and modifications as fall within the true scope of the invention.

What I claim as my invention is:

1. A trigger recognition circuit for a digital oscilloscope, comprising:

an input circuit for receiving input signals;

a waveform digitizer coupled to said input circuit for processing said input signals;

a waveform memory coupled to said waveform digitizer for storing processed input signals;

a trigger circuit coupled to said input circuit, said trigger circuit comprising first and second comparators that simultaneously receive said input signal and further receive independently selectable first and second reference voltage levels thereby to form an adjustable hysteresis gap, and a bistable circuit having first and second output states connected to first and second outputs of said first and second comparators, respectively, such that raw trigger signals are generated when said input signal first passes through said first reference voltage level thereby causing a first change in output states of said bistable circuit and then passes back through said first reference voltage level and said second reference voltage level thereby causing a second change in output states of said bistable circuit; and an acquisition logic circuit coupled to said waveform digitizer, said waveform memory and said trigger circuit for comparing said processed input signals with stored processed input signals thereby to recognize a previously established pattern, and qualifying a valid trigger when one of said raw triggers has a predetermined relationship with said pattern.

2. A trigger recognition system in accordance with claim 1 wherein said first and second reference voltage levels are provided by said acquisition logic circuit.

3. A trigger recognition system in accordance with claim 1 wherein said previously-established pattern is a time interval between successive raw triggers.

4. A trigger recognition system in accordance with claim 1 wherein said predetermined relationship with said pattern is an expected time window within which said raw trigger must appear.

5. A trigger recognition system in accordance with claim 1 wherein said predetermined relationship with said pattern is an expected time window outside of which said raw trigger must appear.

* * * * *